(12) United States Patent
Freitag

(10) Patent No.: US 8,004,800 B2
(45) Date of Patent: *Aug. 23, 2011

(54) MAGNETORESISTIVE SENSOR WITH NITROGENATED HARD BIAS LAYER FOR IMPROVED COERCIVITY

(75) Inventor: James Mac Freitag, Sunnyvale, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 843 days.

This patent is subject to a terminal disclaimer.

(21) Appl. No.: 11/959,327

(22) Filed: Dec. 18, 2007

(65) Prior Publication Data

US 2009/0154032 A1    Jun. 18, 2009

(51) Int. Cl.
G11B 5/39    (2006.01)

(52) U.S. Cl. .................................................. 360/324.12

(58) Field of Classification Search ............. 360/324.12, 360/327.1
See application file for complete search history.

(56) References Cited

U.S. PATENT DOCUMENTS

| | | | |
|---|---|---|---|
| 6,103,136 A | 8/2000 | Han et al. | 216/22 |
| 6,512,661 B1 | 1/2003 | Louis | 360/324.12 |
| 6,636,400 B2 | 10/2003 | Pinarbasi et al. | 360/324.12 |
| 6,884,632 B2 | 4/2005 | Baglin et al. | 438/3 |
| 7,016,165 B2 | 3/2006 | Chien et al. | 360/324.12 |
| 7,042,674 B1 | 5/2006 | Baril et al. | 360/75 |
| 7,130,165 B2 | 10/2006 | Macken et al. | 360/324.12 |
| 7,220,499 B2 | 5/2007 | Saito et al. | 428/811.5 |
| 7,248,445 B2 | 7/2007 | Nishiyama | 360/324.1 |
| 7,248,447 B2 | 7/2007 | Gill | 360/324.11 |
| 7,251,110 B2 | 7/2007 | Lee et al. | 360/324.1 |
| 7,397,640 B2 * | 7/2008 | Pinarbasi | 360/324.12 |
| 7,440,242 B2 * | 10/2008 | Pinarbasi | 360/324.12 |
| 7,440,243 B2 * | 10/2008 | Freitag et al. | 360/324.12 |
| 7,502,209 B2 * | 3/2009 | Freitag et al. | 360/324.12 |
| 2002/0186516 A1 * | 12/2002 | Larson et al. | 360/324.12 |
| 2005/0238924 A1 | 10/2005 | Gill | 428/837 |
| 2006/0002041 A1 | 1/2006 | Pinarbasi | 360/324.12 |
| 2006/0012925 A1 * | 1/2006 | Pinarbasi | 360/324.1 |
| 2007/0091515 A1 * | 4/2007 | Freitag et al. | 360/324.12 |

OTHER PUBLICATIONS

Childress et al., "Spin-Valve and Tunnel-Valve Structures With In Situ In-Stack Bias" IEEE Transactions on Magnetics, vol. 38, No. 5, Sep. 2002.

Zheng et al., "Stability in In-Stack Biased CPP SV Heads" IEEE Transactions on Magnetics, vol. 40, No. 4, Jul. 2004.

* cited by examiner

*Primary Examiner* — Craig A. Renner
*Assistant Examiner* — Carlos E Garcia
(74) *Attorney, Agent, or Firm* — Zilka-Kotab, PC

(57) ABSTRACT

A magnetoresistive sensor having a hard bias structure that provides improved bias field robustness. The sensor includes a nitrogenated hard bias layer and a seed layer that include a nitrogenated NiTa layer and a layer of Ru. The seed layer can also include a layer of CrMn disposed between the layer of NiTa and the layer of Ru. The novel seed structure allows a nitrogenated hard bias layer to be used, while maintaining a high magnetic coercivity of the hard bias layer.

16 Claims, 7 Drawing Sheets

MAGNETORESISTIVE SENSOR WITH NITROGENATED HARD BIAS LAYER FOR IMPROVED COERCIVITY

FIELD OF THE INVENTION

This invention relates to magnetoresistive sensor free layer biasing, and more particularly to a sensor having nitrogenated layers in a hard bias structure for improved magnetic coercivity and increased free layer stability.

BACKGROUND OF THE INVENTION

The heart of a computer's long-term memory is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air-bearing surface (ABS). The suspension arm biases the slider toward the surface of the disk and when the disk rotates, air adjacent to the surface of the disk moves along with the disk. The slider flies on this moving air at a very low elevation (fly height) over the surface of the disk. This fly height can be on the order of Angstroms. When the slider rides on the air bearing, the write and read heads are employed for writing magnetic transitions to and reading magnetic transitions from the rotating disk. The read and write heads are connected to processing circuitry that operates according to a computer program to implement the writing and reading functions.

The write head includes a coil layer embedded in first, second and third insulation layers (insulation stack), the insulation stack being sandwiched between first and second pole piece layers. A gap is formed between the first and second pole piece layers by a gap layer at an air-bearing surface (ABS) of the write head and the pole piece layers are connected at a back gap. Current conducted to the coil layer induces a magnetic flux in the pole pieces which causes a magnetic field to fringe out at a write gap at the ABS for the purpose of writing the aforementioned magnetic impressions in tracks on the moving media, such as in circular tracks on the aforementioned rotating disk.

In recent read head designs a spin valve sensor, also referred to as a giant magnetoresistive (GMR) sensor, has been employed for sensing magnetic fields from the rotating magnetic disk. This sensor includes a nonmagnetic conductive layer, referred to as a spacer layer, sandwiched between first and second ferromagnetic layers, and hereinafter referred to as a pinned layer and a free layer. First and second leads are connected to the spin valve sensor for conducting a sense current therethrough. The magnetization of the pinned layer is pinned perpendicular to the air-bearing surface (ABS) and the magnetic moment of the free layer is biased parallel to the ABS, but is free to rotate in response to external magnetic fields. The magnetization of the pinned layer is typically pinned by exchange coupling with an antiferromagnetic layer.

The thickness of the spacer layer is chosen to be less than the mean free path of conduction electrons through the sensor. With this arrangement, a portion of the conduction electrons is scattered by the interfaces of the spacer layer with each of the pinned and free layers. When the magnetizations of the pinned and free layers are parallel with respect to one another, scattering is minimal and when the magnetizations of the pinned and free layer are antiparallel, scattering is maximized. Changes in scattering alter the resistance of the spin valve sensor in proportion to $\cos \theta$, where $\theta$ is the angle between the magnetizations of the pinned and free layers. In a read mode, the resistance of the spin valve sensor changes proportionally to the magnitudes of the magnetic fields from the rotating disk. When a sense current is conducted through the spin valve sensor, resistance changes cause potential changes that are detected and processed as read back signals.

SUMMARY OF THE INVENTION

The present invention provides a magnetoresistive sensor having improved hard bias robustness. The sensor includes a sensor stack having a hard bias structure formed at either side. The hard bias structure includes a nitrogenated seed layer structure and a Ru seed layer formed over the nitrogenated NiTa seed layer. A hard bias layer is formed over the NiTa seed layer and the Ru seed layer.

The hard bias layer can be constructed of CoPt and can also be nitrogenated. Nitrogenating the hard bias layer improves hard bias stabilization by tightening asymmetry distributions. The seed layer structure, advantageously causes the nitrogenated hard bias layer to maintain a high coercivity, which is necessary for magnetic biasing robustness. A CoMn seed layer can be provided between the NiTa layer and the Ru layer.

These and other advantages and features of the present invention will be apparent upon reading the following detailed description in conjunction with the Figures.

BRIEF DESCRIPTION OF THE DRAWINGS

For a fuller understanding of the nature and advantages of this invention, as well as the preferred mode of use, reference should be made to the following detailed description read in conjunction with the accompanying drawings that are not to scale.

DETAILED DESCRIPTION OF THE INVENTION

The following describes various embodiments presently contemplated for carrying out this invention. This description is made for the purpose of illustrating the general principles of this invention and is not meant to limit the inventive concepts claimed herein.

Figure 1:
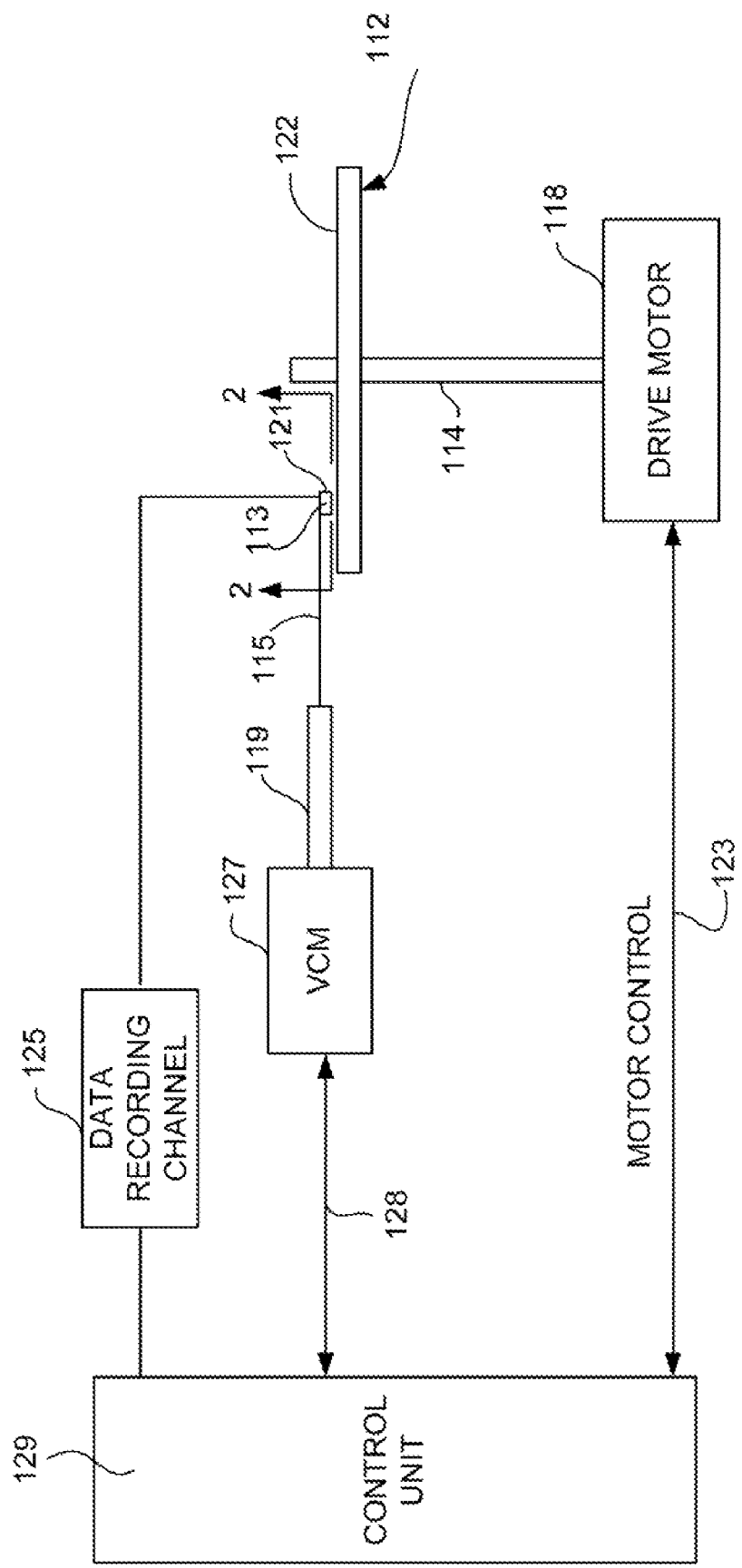
FIG. 1 is a schematic illustration of a disk drive system in which the invention might be embodied.

Referring now to FIG. 1, there is shown a disk drive 100 embodying this invention. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 may access different tracks of the magnetic disk where desired data are written. Each slider 113 is attached to an actuator arm 119 by way of a suspension 115. The suspension 115 provides a slight spring force, which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122, which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
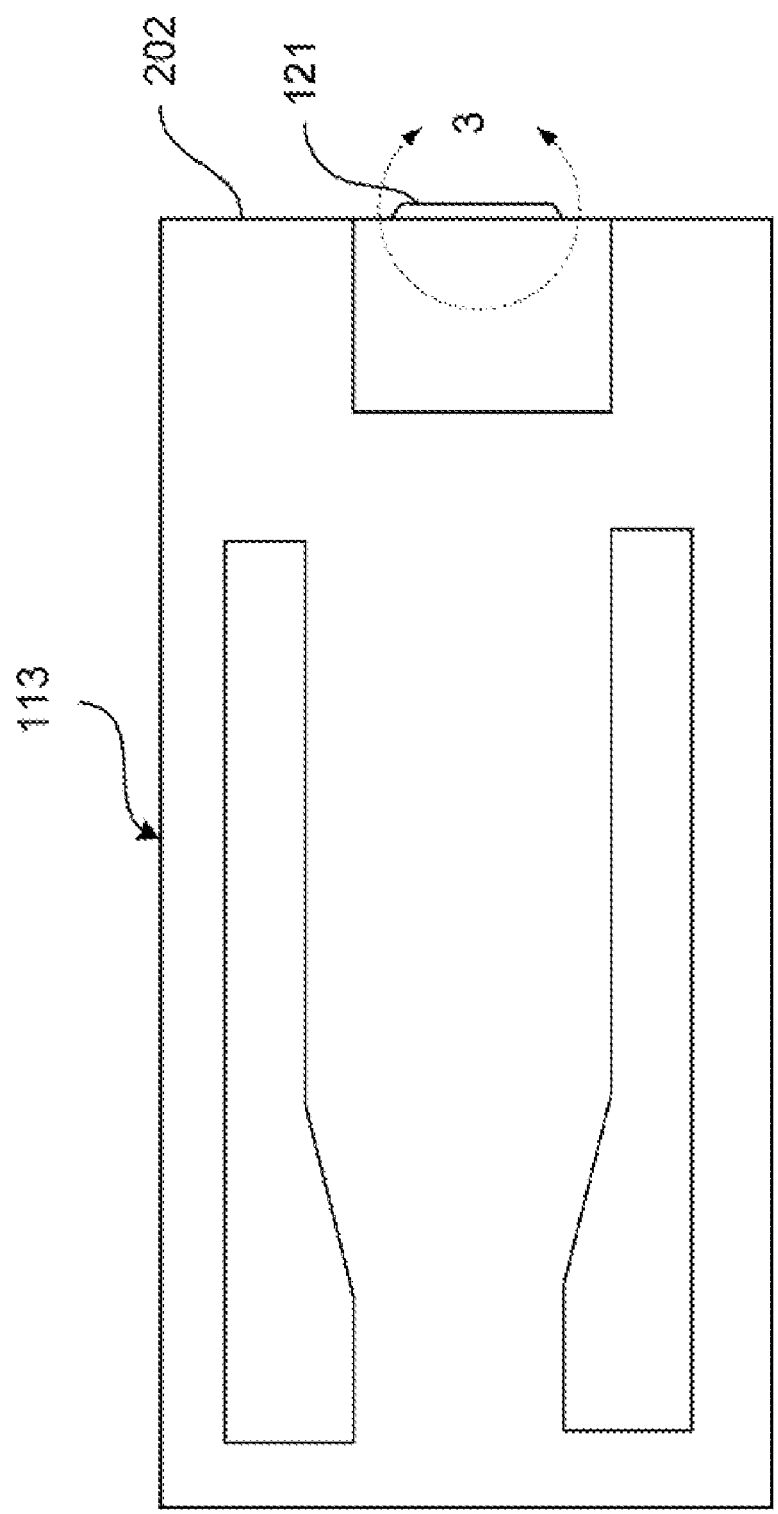
FIG. 2 is an ABS view of a slider, taken from line 2-2 of FIG. 1, illustrating the location of a magnetic head thereon.

With reference to FIG. 2, the orientation of the magnetic head 121 in a slider 113 can be seen in more detail. FIG. 2 is an ABS view of the slider 113, and as can be seen, the magnetic head including an inductive write head and a read sensor, is located at a trailing edge of the slider 202. The above description of a typical magnetic disk storage system, and the accompanying illustration of FIG. 1 are for representation purposes only. It should be apparent that disk storage systems may contain a large number of disks and actuators, and each actuator may support, a number of sliders.

Figure 3:
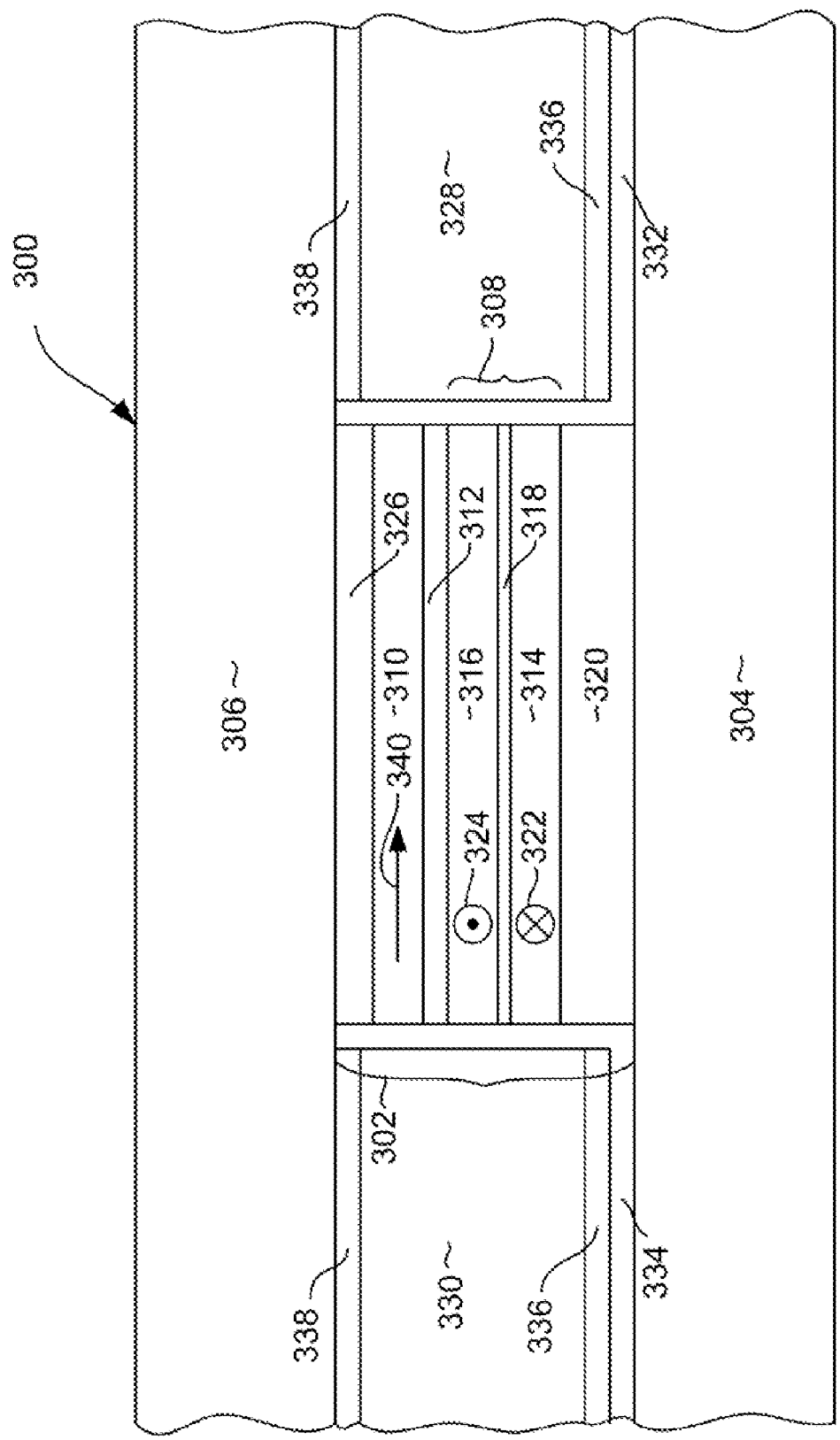
FIG. 3 is an ABS view of a magnetoresistive sensor according to an embodiment of the present invention taken from circle 3 of FIG. 2.

With reference now to FIG. 3, a magnetoresistive sensor 300 includes a sensor stack 302 sandwiched between first and second electrically conductive leads 304, 306. The leads 304, 306 can be constructed of a magnetic material such as NiFe so that they can function as magnetic shields as well as leads.

The sensor stack 302 includes a pinned layer structure 308 and a magnetic free layer 310. A non-magnetic layer 312 is sandwiched between the free layer 310 and the pinned layer structure 308. The sensor 300 can be a giant magnetoresistive (GMR) sensor or can be a tunnel valve sensor. If the sensor is a GMR sensor, the non-magnetic layer 312 is an electrically conductive spacer layer such as Cu or CuO. If the sensor 300 is a tunnel valve, then the non-magnetic layer 312 is a thin, electrically insulating barrier layer.

The pinned layer structure 308 can be an antiparallel coupled structure that includes first and second magnetic layers AP1 314 and AP2 316, which are antiparallel coupled across a non-magnetic coupling layer 318 sandwiched therebetween. A layer of antiferromagnetic material (AFM layer) 320 is exchange coupled with the AP1 layer 314, which strongly pins the magnetization 322 of the AP1 layer 314 in a first direction that is perpendicular to the air bearing surface as indicated by arrow tail symbol 322. Antiparallel coupling between the AP1 and AP2 layers 314, 316 pins the magnetization of the AP2 layer in a second direction, opposite to the first direction, as indicated by arrow head symbol 324. A capping layer 326 such as Ta can be provided at the top of the sensor stack 302 to protect the sensor layers during manufacture.

With continued reference to FIG. 3, first and second hard bias layers 328, 330 are provided at either side of the sensor stack 302, and are separated from the sensor stack 302 and from at least one of the leads 304 by insulation layers 332, 334. The hard bias layers 328, 330 are constructed of a magnetically hard, high coercivity material. A seed layer structure 336 is formed beneath each of the hard bias layers 328, 330 to improve the magnetic grains structure and magnetic properties of the hard bias layers 328, 330 as will be described further herein below. A hard bias capping layer structure 338 can be provided at the top of each of the bias layers 328, 330, as will also be further described below.

When magnetized, the hard bias layers 328, 330 provide a magnetic bias field that biases the magnetization of the free layer in a desired direction parallel with the air bearing surface as indicated by arrow 340. The insulation layers 332, 334, which can be constructed of a material such as alumina, prevent current from being shunted through the hard bias layers 328, 330 during operation.

It should be pointed out that the sensor 300 is being described herein as a current perpendicular to plane (CPP) sensor, although this is for purposes of illustration only. The sensor could also be a Current in Plane (CIP) sensor such as a CIP giant magnetoresistive (GMR) sensor.

Figure 4:
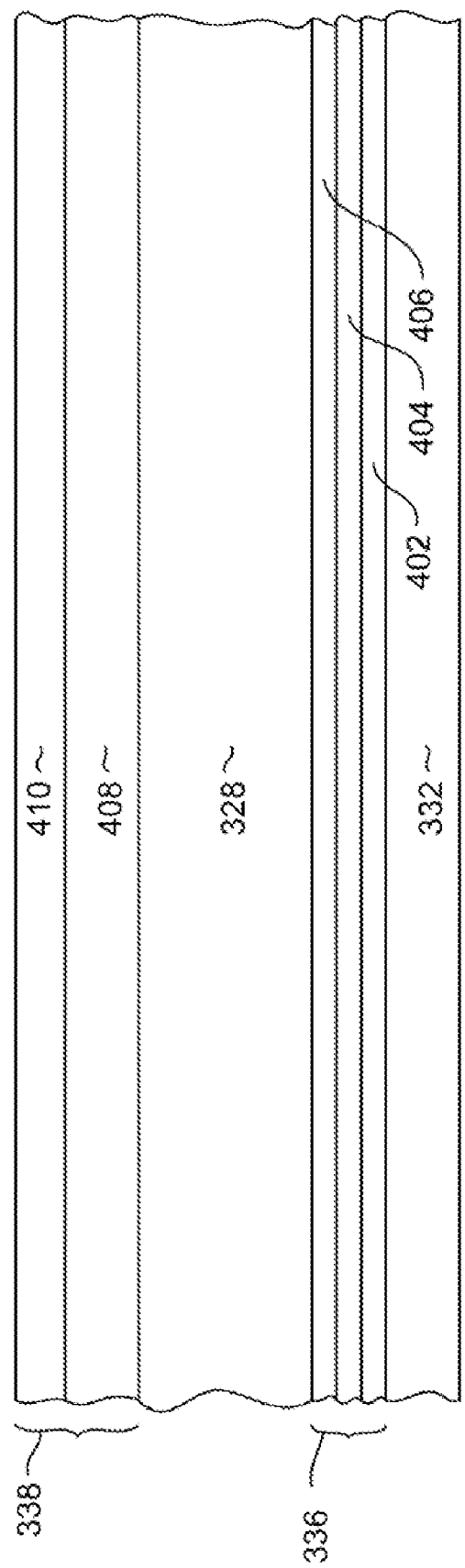
FIG. 4 is an enlarged view of a hard bias structure according to an embodiment of the invention.

With reference now to FIG. 4, an enlarged view of one of the hard bias layers 328, seed layer 336 and capping layer 338 illustrates a novel hard bias structure with increased coercivity and magnetic squareness. The seed layer 336 is a tri-layer structure that includes a first layer constructed of a nitrogenated material, such as nitrogenated NiTa, preferably having a thickness of 10-30 Angstroms or about 15 Angstroms. This first layer is nitrogenated, meaning that it has been deposited by a process such as ion beam sputtering, in a tool having an atmosphere that includes a small amount of nitrogen (N). For example, the first layer 402 can be deposited in an ion beam sputtering tool having an atmosphere such as Xe or Ar, with small amounts of N added. The nitrogenation of the first layer improves the in-plane orientation of the grain structure. Also, this nitrogenation can result in trace amounts of N being disposed within the layer 402, which as mentioned above can comprise NiFe.

The seed layer further includes a second layer 404, which can be, for example, CrMn, formed over the first layer. The second layer 404 can have a thickness of 5-20 Angstroms or about 10 Angstroms. The seed layer still further includes a third layer 406, which can be constructed of Ru formed over the second layer. The Ru third layer 406 preferably has a thickness of 3-8 Angstroms.

The hard bias layer 328 formed over the seed layer 336 can be constructed of CoPt and can have a thickness of 100 to 200 Angstroms or about 150 Angstroms. The hard bias layer 328 is also nitrogenated. Therefore, the hard bias layer 328 is deposited (such as by ion beam sputtering) in an atmosphere that include a small amount of N. The hard bias layer 328 can, therefore, include trace amounts of N. As with the layer 404, the hard bias layer 328 can be deposited in an in beam sputter deposition tool that has an atmosphere of Xe or Ar with a small amount of N, and this nitrogenation of the hard bias layer 328 improves the grain structure, providing better control of the in plane orientation of the grain structure.

The capping layer 338, formed over the hard bias layer 328 can include a layer 408 of Rh and a layer of Ta formed over the layer of Ru. The layer of Rh 408 can have a thickness of about 40 Angstroms and the Ta layer 410 can have a thickness of about 20 Angstroms.

Figure 5:
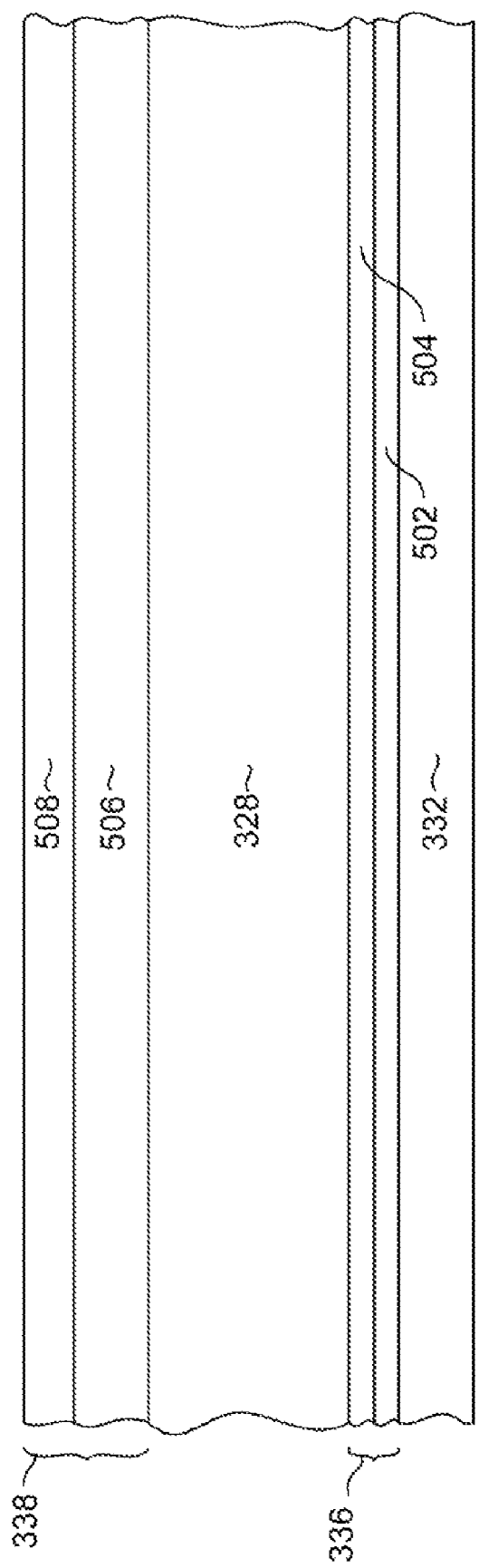
FIG. 5 is an enlarged view of a hard bias structure according to another embodiment of the invention.

With reference to FIG. 5, another embodiment of the invention is described. In this embodiment, the seed layer 336 is a bi-layer structure that includes a layer of a material such as NiTa 502 having a thickness of 10-30 Angstroms or about 15 Angstroms. As with the previously described embodiment, the first layer 502 is nitrogenated by depositing it in an atmosphere that contains a small amount of N. The seed layer structure 336 also includes a layer of Ru 504 deposited over the layer of nitrogenated material (e.g. nitrogenated NiTa). This layer 504 can have a thickness of 3-8 Angstroms.

The bias layer 328 is constructed of a hard magnetic material, such as nitrogenated CoPt, and can have a thickness of 100-200 Angstroms or about 150 Angstroms. The capping layer structure 338 can include a layer of Ru having a thickness of about 40 Angstroms and a layer of Ta having a thickness of about 20 Angstroms.

Figure 6:
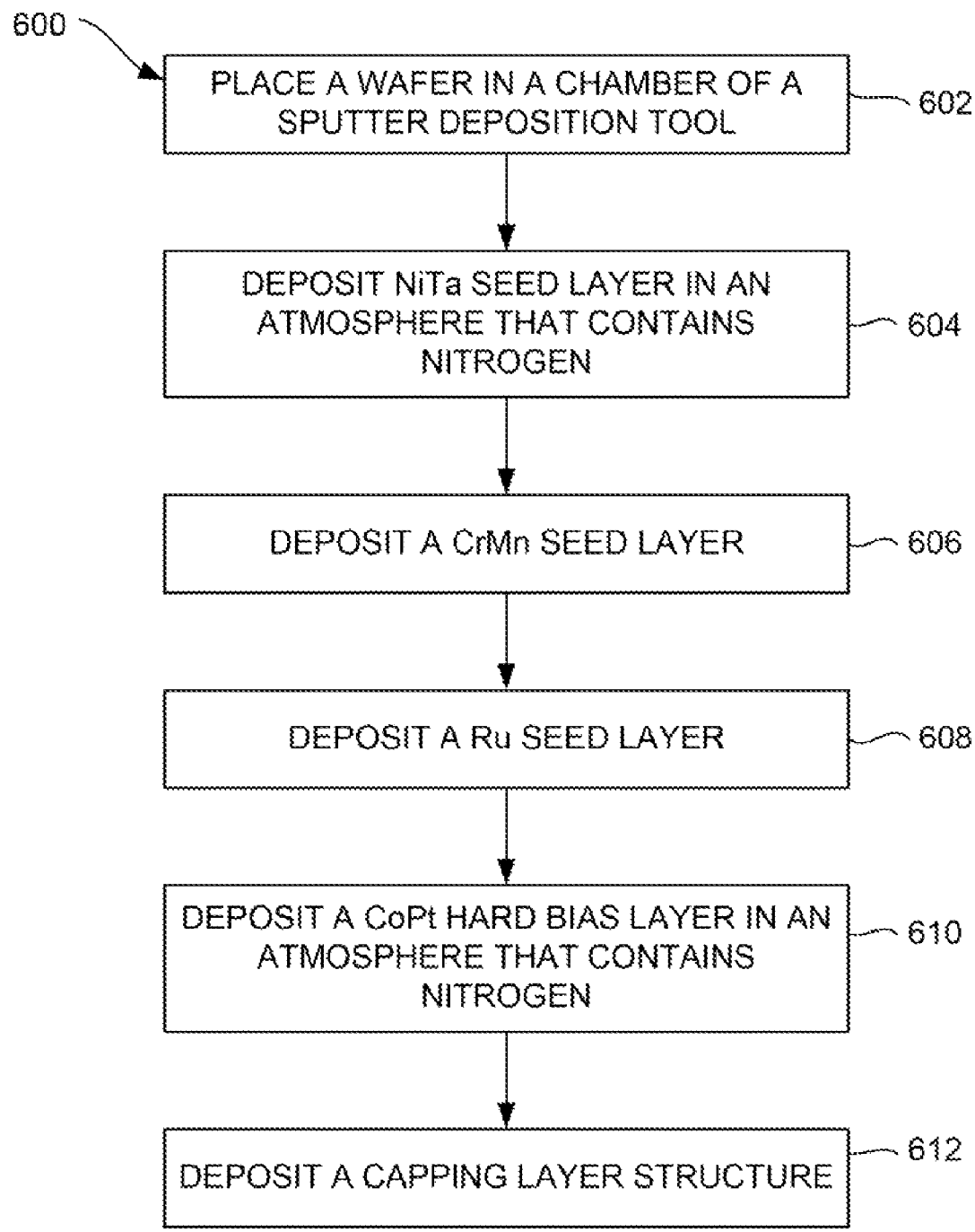
FIG. 6 is a flow chart illustrating a method of manufacturing a magnetoresistive sensor according to an embodiment of the invention.

With reference now to FIG. 6 a method 600 for manufacturing a sensor having a bias structure such as that described above with reference to FIG. 4 is summarized. In a step 602 a wafer is placed into a chamber of a sputter deposition tool, which is preferably an ion beam sputter deposition tool. Then, in a step 604 a seed layer such as NiFe is deposited. This seed layer is deposited in an atmosphere such as a Xenon or argon atmosphere that contains a small amount of nitrogen. The NiTa seed layer can be deposited to a thickness of 10-20 Angstroms or about 15 Angstroms.

Then, in a step 606 a layer of material such as CrMn seed layer is deposited. The CrMn layer can be deposited to a thickness of 5-20 Angstroms or about 15 Angstroms. Then, in a step 608 a layer of a material such as Ru is deposited preferably to a thickness of 3-8 Angstroms. Then, in a step 610 a layer of hard bias material such as CoPt is deposited. The CoPt layer is deposited in an atmosphere such as a Xenon or argon atmosphere that contains a small amount of nitrogen. Then, in a step 612 a capping layer can be deposited. This step can include depositing a layer of Ru and depositing a layer of Ta.

Figure 7:
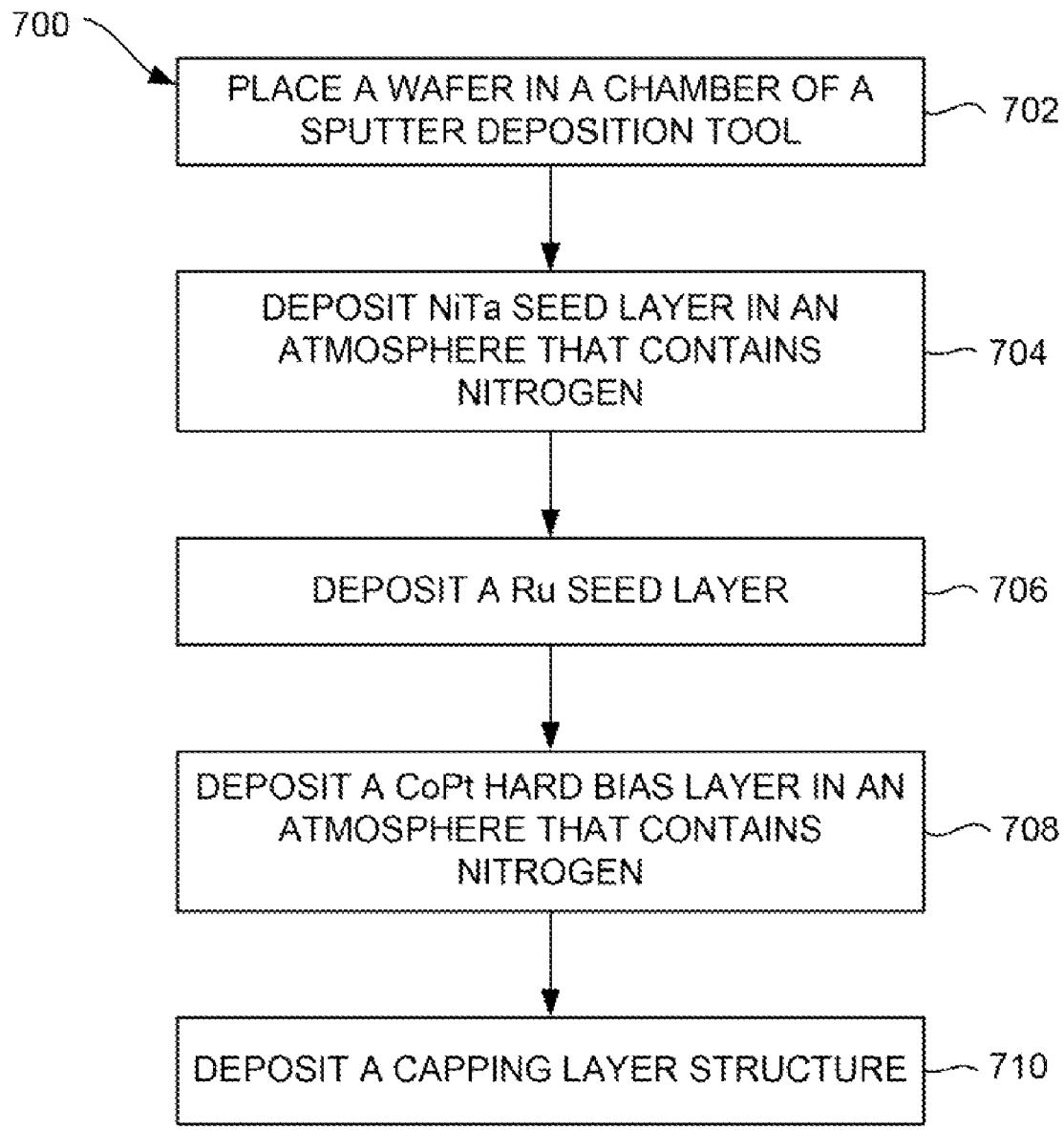
FIG. 7 is a flow chart illustrating a method of manufacturing a magnetoresistive sensor according to another embodiment of the invention.

With reference now to FIG. 7, a method 700 for manufacturing a sensor having a hard bias layer such as that described with reference to FIG. 5 is summarized. In a step 702 a wafer is placed in a sputter deposition tool that is preferably an ion beam sputter deposition tool. In a step 704 a layer of material such as NiTa is deposited in an atmosphere such as Xenon or argon and which contains a small amount of nitrogen. This layer (e.g. NiTa layer) can be deposited to a thickness of 10-30 Angstroms or about 15 Angstroms. Then, in a step 706 a layer of a material such as Ru is deposited. The Ru layer is preferably deposited to a thickness of 2-8 Angstroms. Then, in a step 708 a hard bias layer material such as CoPt is deposited in an atmosphere such as a Xenon or argon atmosphere that contains a small amount of nitrogen. In a step 712 a capping layer structure can be deposited over the hard bias layer by depositing a first capping layer material (preferably Rh) and a second layer of a material such as Ta.

The above structure and method of manufacturing such as structure provides a sensor with improved hard bias performance. Nitrogenated hard bias layers can improve the stability of a sensor by tightening asymmetry distributions. However, in lieu of tire above described structure adding nitrogen to the CoPt hard magnet reduces its coercivity. Therefore, the current state of the art teaches away from the use of nitrogenated hard bias layers, since high coercivity is a necessary feature of hard bias layers. The seed layer structures described above significantly increase the coercivity of the CoPt hard bias layer deposited thereover.

While various embodiments have been described above, it should be understood that they have been presented by way of example only, and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A magnetoresistive sensor, comprising:
   a sensor stack having a free layer, a pinned layer structure and a non-magnetic layer sandwiched between the free layer and pinned layer structure, the sensor stack having first and second laterally opposed sides;
   first and second hard bias structures formed at each side of the sensor stack, each hard bias structure further comprising:
   a first seed layer having trace amounts of nitrogen;
   a second seed layer comprising Ru formed over the first seed layer; and
   a hard magnetic layer formed over the first and second seed layers, the hard magnetic layer including trace amounts of nitrogen.

2. A magnetoresistive sensor as in claim 1 wherein the hard magnetic layer comprises CoPt with trace amounts of nitrogen.

3. A magnetoresistive sensor as in claim 1 wherein the first seed layer has a thickness of 10-30 Angstroms.

4. A magnetoresistive sensor as in claim 1 wherein the second seed layer has a thickness of 3-8 Angstroms.

5. A magnetoresistive sensor as in claim 1 wherein the first seed layer has a thickness of 10-30 Angstroms and the second seed layer has a thickness of 3-8 Angstroms.

6. A magnetoresistive sensor as in claim 1 wherein the first seed layer has been nitrogenated by depositing it in an atmosphere that includes nitrogen, resulting in the first seed layer having a crystal structure with improved in plane orientation.

7. A magnetoresistive sensor as in claim 1 wherein the hard magnetic layer comprises CoPt, and wherein the first seed layer and the hard magnetic layer have been nitrogenated by depositing them in an atmosphere that includes nitrogen, resulting in the first seed layer and the hard magnetic layer each having a crystal structure with improved in plane orientation and improved grain size.

8. A magnetoresistive sensor as in claim 1 further comprising a third seed layer comprising CrMn sandwiched between the first seed layer and the second seed layer.

9. A magnetoresistive sensor as in claim 8 wherein the first seed layer has a thickness of 10-30 Angstroms.

10. A magnetoresistive sensor as in claim 8 wherein the third seed layer has a thickness of 5-20 Angstroms.

11. A magnetoresistive sensor as in claim 8 wherein the second seed layer has a thickness of 3-8 Angstroms.

12. A magnetoresistive sensor as in claim 8 wherein the first seed layer has a thickness of 10-30 Angstroms, third seed layer has a thickness of 5-20 Angstroms and the second seed layer has a thickness of 3-8 Angstroms.

13. A magnetoresistive sensor as in claim 8 wherein the hard magnetic layer comprises CoPt having trace amounts of nitrogen.

14. A magnetoresistive sensor as in claim 8 wherein the hard magnetic layer comprises CoPt having trace amounts of nitrogen, and wherein the first seed layer and the hard magnetic layer are nitrogenated by depositing them in an atmosphere that includes nitrogen, resulting in the first seed layer and the hard magnetic layer each having a crystal structure with improved in plane orientation and improved grain size.

15. A magnetoresistive sensor as in claim 1 further comprising an electrically insulating layer formed between the sensor stack and each of the hard bias structures.

16. A sensor as in claim 1 wherein the first seed layer comprises NiTa.

* * * * *

UNITED STATES PATENT AND TRADEMARK OFFICE
CERTIFICATE OF CORRECTION

PATENT NO.        : 8,004,800 B2
APPLICATION NO.   : 11/959327
DATED             : August 23, 2011
INVENTOR(S)       : Freitag Page 1 of 1

It is certified that error appears in the above-identified patent and that said Letters Patent is hereby corrected as shown below:

In the Specification:

Column 5, line 56 replace "lieu of tire" with --lieu of the--.

Signed and Sealed this
Twenty-first Day of July, 2015

Michelle K. Lee
*Director of the United States Patent and Trademark Office*